(12) United States Patent
Chen et al.

(10) Patent No.: US 6,782,883 B2
(45) Date of Patent: Aug. 31, 2004

(54) CUTTING DEVICE FOR BREAKING FRAGILE MATERIALS SUCH AS SEMICONDUCTOR WAFERS OR THE LIKE

(75) Inventors: Kuei-Jung Chen, Miaoli (TW); Meng-Chun Chen, Tainan (TW); Chih-Yi Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/358,251

(22) Filed: Feb. 5, 2003

(65) Prior Publication Data
US 2004/0094010 A1 May 20, 2004

(30) Foreign Application Priority Data
Nov. 14, 2002 (TW) ....................................... 91218304 U

(51) Int. Cl.⁷ ................................................. B28D 1/32
(52) U.S. Cl. .................................. 125/23.01; 125/13.01
(58) Field of Search ............................ 125/13.01, 23.01

(56) References Cited

U.S. PATENT DOCUMENTS

| 4,790,465 A | * | 12/1988 | Fellows et al. ................. 225/2 |
| 5,327,625 A | * | 7/1994 | Clark et al. ................. 29/25.01 |
| 5,873,773 A | * | 2/1999 | Bando .......................... 451/70 |
| 6,536,121 B1 | * | 3/2003 | Ishikawa et al. ............. 33/18.1 |
| 6,561,066 B2 | * | 5/2003 | Sekiya ........................ 83/76.6 |

* cited by examiner

Primary Examiner—Charles Goodman
(74) Attorney, Agent, or Firm—Rabin & Berdo, P.C.

(57) ABSTRACT

A cutting device for breaking fragile materials is constructed to include a lifting mechanism adapted to move the cutter vertically, a rotary table adapted to control the cutting angle of the cutter on the workpiece, a feed mechanism adapted to control the federate of the cutter, and a rotary mechanism adapted to rotate the cutter for enabling the cutter to cut the workpiece with one of multiple cutting points thereof selectively.

20 Claims, 6 Drawing Sheets

CUTTING DEVICE FOR BREAKING FRAGILE MATERIALS SUCH AS SEMICONDUCTOR WAFERS OR THE LIKE

BACKGROUND OF THE INVENTION

1. Field of the Invention

The present invention relates to a cutting device for breaking fragile materials such as semiconductor wafers or the like and, more particularly, to such a cutting device, which uses lifting, rotary, and feed mechanisms to adjust the position and angle of the diamond cutter, enabling the diamond cutter to scribe and break the workpiece precisely.

2. Description of Related Art

In semiconductor foundries, wafer scribing and breaking apparatus are used to scribe and break 8" or 12" semiconductor wafers into individual dies. The cutting tips of cutters for use in wafer scribing and breaking apparatus are commonly made from diamond for the advantage of high hardness. Conventional wafer scribing and breaking apparatus commonly use a rotary mechanism and a feed mechanism to control the cutting position of the diamond cutter relative to the workpiece. This design can simply achieve a coarse manipulation, i.e., the distance between the cutter and the workpiece cannot be precisely controlled, affecting the precision of the scribing of the cutter on the workpiece.

Further, during cutting working of the diamond cutter according to conventional methods, one specific crystal phase position of the diamond cutter is used as the cutting point. This cutting point wears quickly with use. When the cutting point worn out, the diamond cutter becomes useless and must be replaced. When a new diamond cutter installed, the alignment of the newly installed diamond cutter must be calibrated again. It takes time to calibrate the alignment of the loaded diamond cutter. Additionally, it is very hard to manually adjust the angle of the specific crystal phase point of the newly installed diamond cutter to a precise position corresponding to the workpiece.

Therefore, it is desirable to provide a cutting device for breaking fragile materials that eliminates the aforesaid drawbacks.

SUMMARY OF THE INVENTION

It is one object of the present invention to provide a cutting device for breaking fragile materials, which uses lifting, rotary, and feed mechanisms to adjust the position and angle of the diamond cutter, enabling the diamond cutter to scribe the workpiece precisely.

It is another object of the present invention to provide a cutting device for breaking fragile materials, which uses a feed mechanism to control the federate of the diamond cutter relative to the fragile workpiece.

It is still another object of the present invention to provide a cutting device for breaking fragile materials, which uses a rotary mechanism to adjust the angle of the diamond cutter, enabling the diamond cutter to scribe the fragile workpiece with one of multiple cutting points thereof.

To achieve these and other objects of the present invention, the cutting device for breaking fragile materials is comprised of a base frame, a lifting mechanism, a rotary table, a cutter holder, and a cutter module. The base frame is installed in a worktable of a wafer scribing and breaking apparatus, having a front mounting face. The lifting mechanism comprises a base block fixedly mounted on the mounting face of the base frame, and a lifting block coupled to the base block for vertical movement on the base block. The rotary table comprises a fixed member fixedly mounted on the lifting block of the lifting mechanism, and a rotary member supported on the fixed member for rotation relative to the fixed member. The rotary member has a front face. The cutter holder is installed in the front face of the rotary member, having a through hole. The through hole has a center axis in parallel to the front face of the rotary member. The cutter module is installed in the through hole of the cutter holder and holding a diamond cutter, comprising a rotary mechanism adapted to rotate the diamond cutter around the center axis of the through hole and a feed mechanism adapted to move the diamond cutter axially along the center axis of the through hole.

By means of the linear or rotary motion of the lifting mechanism, the rotary table and the feed mechanism of the cutter module, the position of the diamond cutter can be precisely adjusted, i.e., the diamond cutter can be shifted vertically through a coarse manipulation of the lifting mechanism, and then rotated to the desired cutting angle on the workpiece, for example, a semiconductor wafer, and then linearly adjusted through a fine micromanipulation of the feed mechanism of the cutter module. Therefore, the relative angle and distance between the diamond cutter and the semiconductor wafer can be adjusted, causing the diamond cutter to scribe the semiconductor wafer precisely.

Furthermore, when the diamond cutter started to wear after long uses, the rotary mechanism is controlled to rotate the diamond cutter through an angle (for example, 90°), enabling the diamond cutter to cut the workpiece with another crystal phase cutting point. Therefore, the diamond cutter can be rotated to different angular positions to cut the workpiece with different crystal phase cutting points, preventing the occurrence of a precision problem due to a replacement of the diamond cutter.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
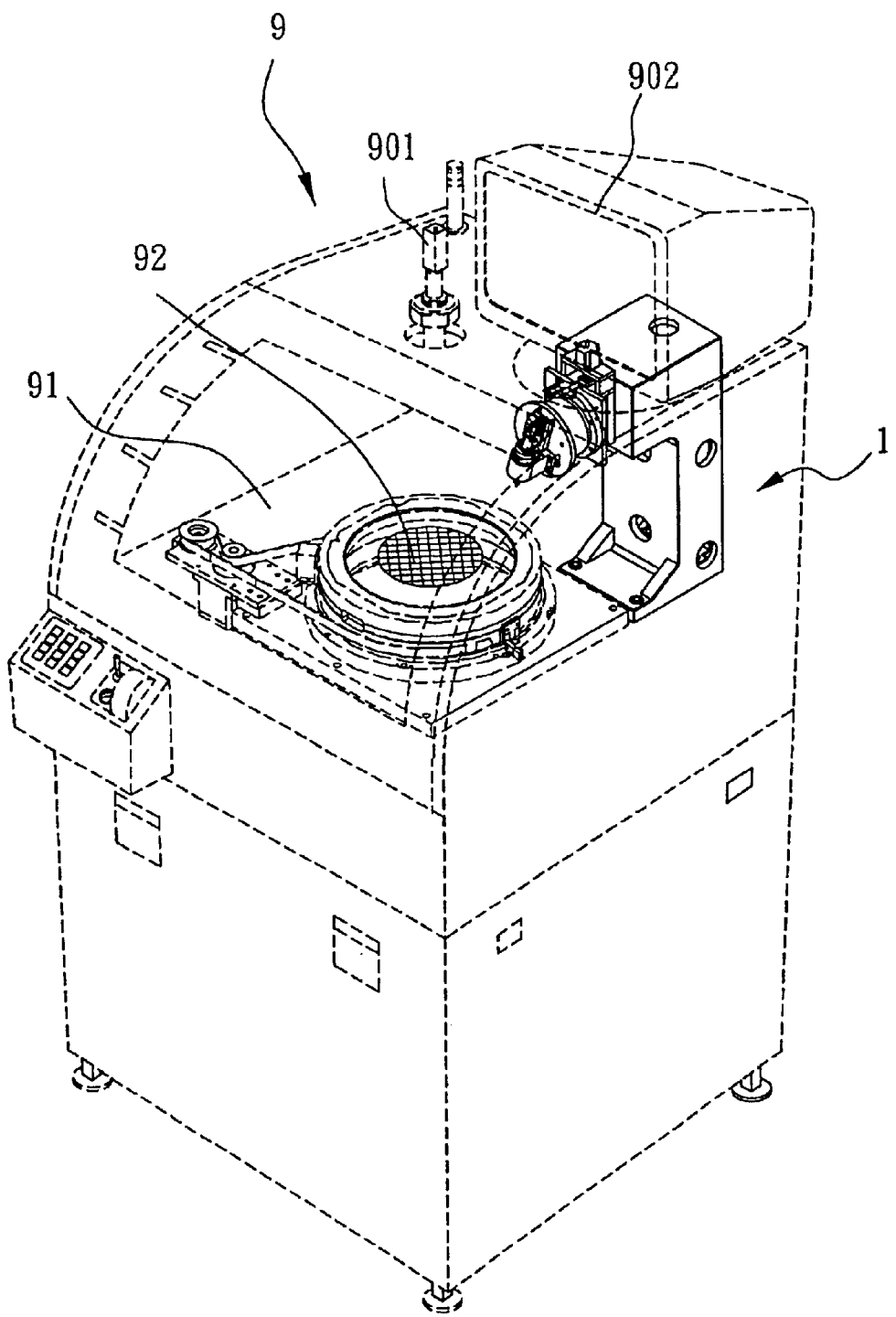
FIG. 1 illustrates a cutting device installed in a wafer scribing and breaking apparatus according to the present invention.

With reference to FIG. 1, a cutting device 1 is installed in the worktable 91 of a wafer scribing and breaking apparatus 9, and controlled to scribe a semiconductor wafer 92.

Figure 2:
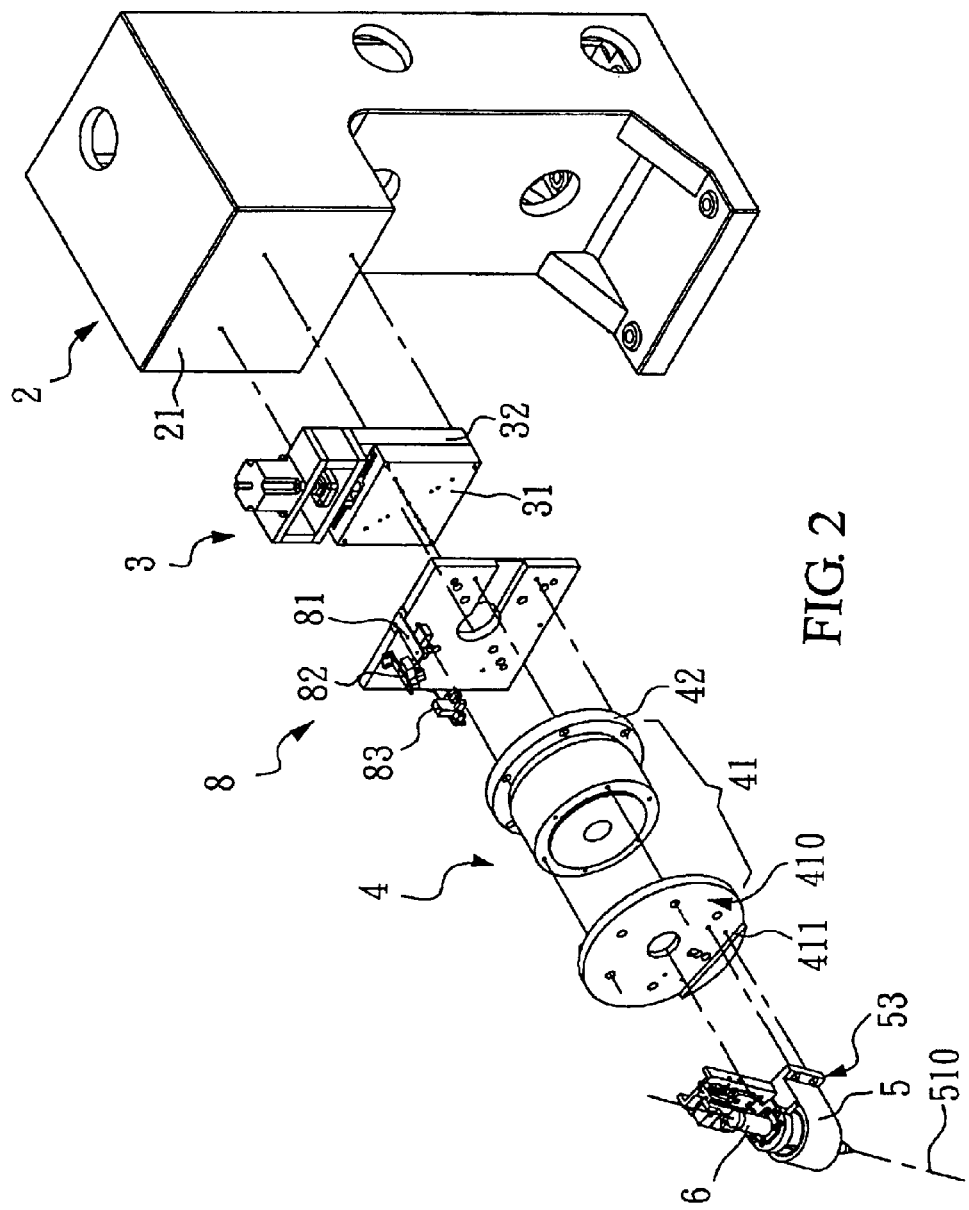
FIG. 2 is an exploded view of the cutting device according to the present invention.

With reference to FIG. 2, the aforesaid fragile material cutting mechanism is comprised of a base frame 2, a lifting mechanism 3, a rotary table 4, a cutter holder 5, and a cutter module 6. The base frame 2 is installed in the worktable 91 of the wafer scribing and breaking apparatus 9 (see FIG. 1), having a front mounting face 21 at the front side. The lifting mechanism 3 is comprised of a base block 32 located on the mounting face 21 of the base frame 2, and a lifting block 31 coupled to the base block 32 for vertical movement on the base block 32.

Figure 3:
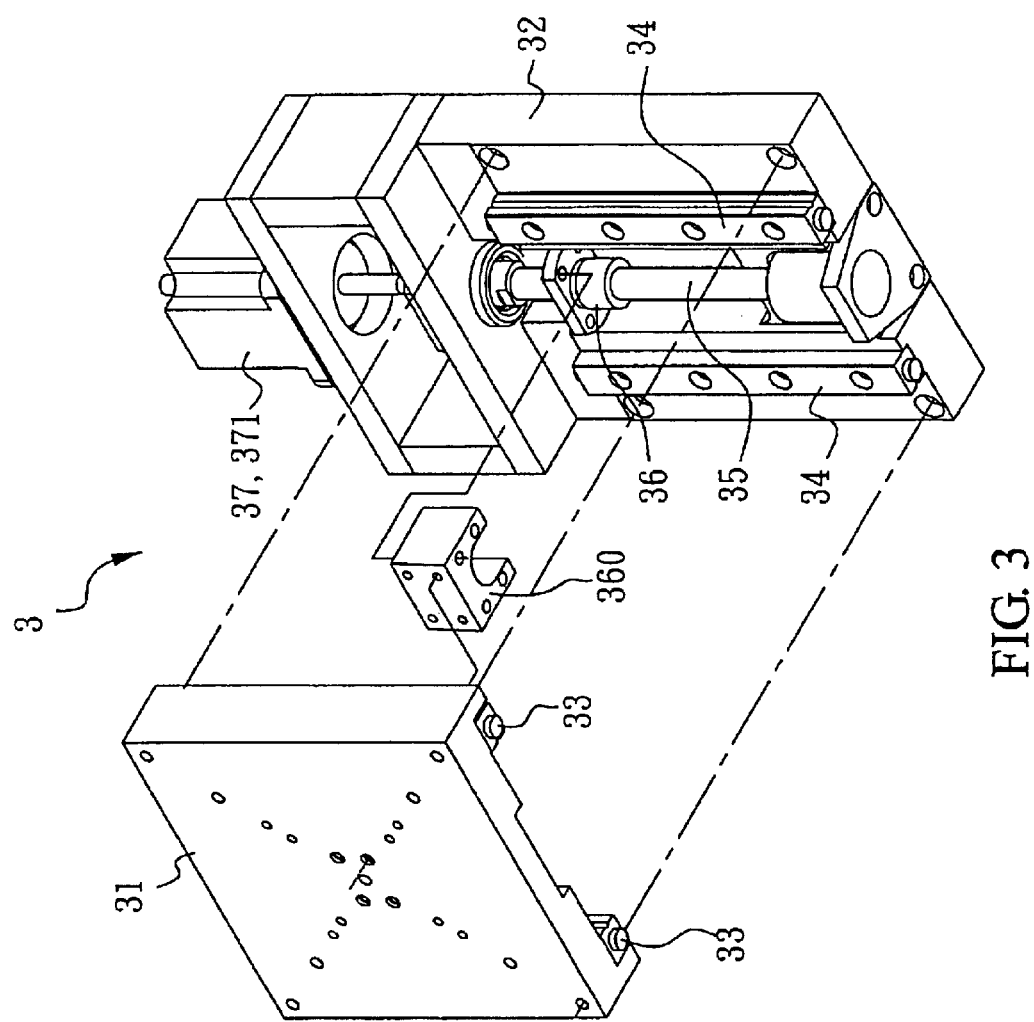
FIG. 3 is an exploded view of the lifting mechanism for the cutting device according to the present invention.

Referring to FIG. 3, the lifting mechanism 3 further comprises a screw rod 35 fastened pivotally with the base block 32, a nut 36 threaded onto the screw rod 35, a connecting block 360 connected between the lifting block 31 and the nut 36, and a power drive 37 adapted to drive the screw rod 35 in the base block 32. When driving the screw rod 35, the lifting block 31 is driven to move with the nut 36 upwards or downwards along the screw rod 35. The screw rod 35 preferably has a relatively greater screw pitch to provide a relatively greater vertical moving distance during lifting/lowering of the lifting mechanism 3.

According to this embodiment, the power drive 37 of the lifting mechanism 3 is a motor 371. Alternatively, a hydraulic cylinder or air cylinder may be used for the power drive 37. Further, a pair of first sliding rails 34 are vertically arranged in parallel on the base block 32, and a pair of second sliding rails 33 are vertically arranged in parallel on the lifting block 31 and respectively coupled to the first sliding rails 34 to guide vertical movement of the lifting block 31 along the first sliding rails 34.

Referring to FIG. 2 again, a coupling plate 8 is fastened to the lifting block 31 to hold the rotary table 4 on the lifting block 31. The rotary table 4 is comprised of a fixed member 42 and a rotary member 41. The rotary member 41 can be rotated on the fixed member 42 by a motor. The coupling plate 8 is connected between the lifting block 31 and the fixed member 42, for enabling the rotary table 4 to be moved vertically up and down with the lifting block 31. The coupling plate 8 has optics sensors 81, 82, 83 for detection of angle of rotation of the rotary member 41. The coupling plate 8 is not requisite, i.e., the fixed member 42 can directly be fastened to the lifting block 31.

The rotary member 41 has a front face 410, and a raised alignment portion 411 for supporting the bottom edge 53 of the cutter holder 5 during installation of the cutter holder 5.

Figure 4:
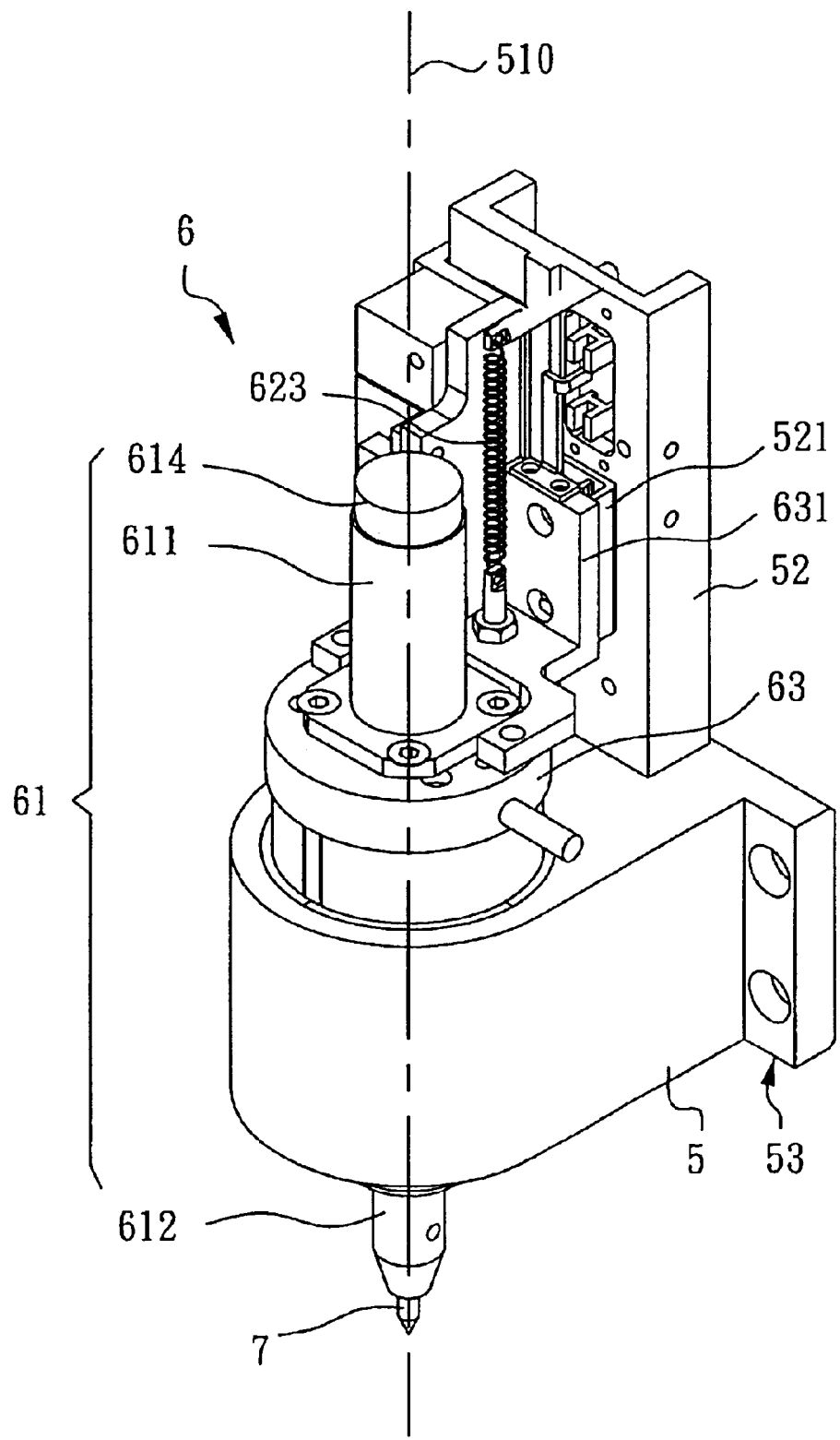
FIG. 4 is an assembly view of the cutter module for the cutting device according to the present invention.
Figure 5:
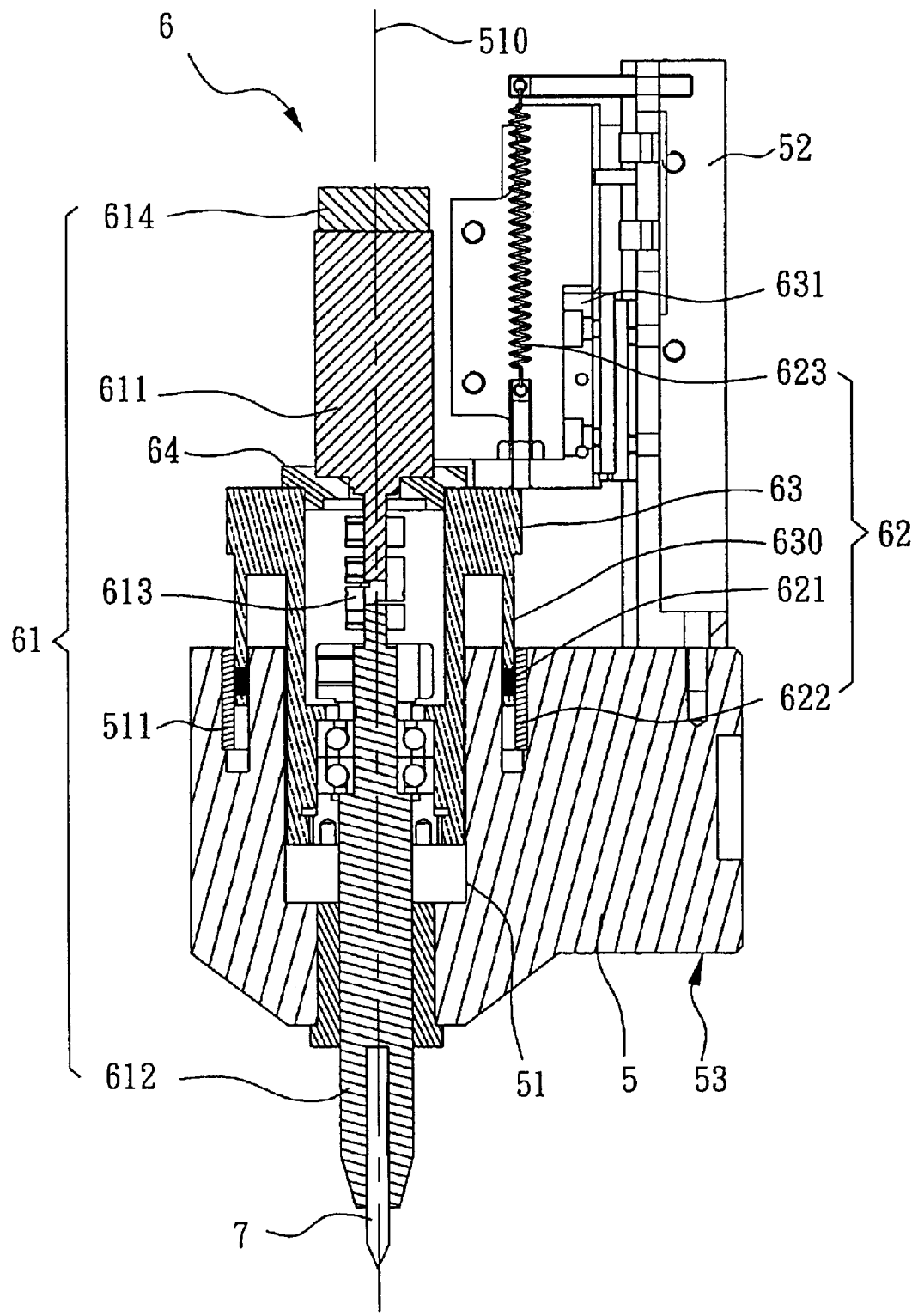
FIG. 5 is a sectional view of the cutter module for the cutting device according to the present invention.

Referring to FIGS. 4 and 5, the cutter holders has a through hole 51. The central axis 510 of the through hole 51 is disposed in parallel to the front face 410 of the rotary member 41. The cutter module 6 is mounted in the through hole 51 of the cutter holder 5 to hold a diamond cutter 7, comprising a rotary mechanism 61 and a feed mechanism 62. The feed mechanism 62 comprises a hollow column 63, a coil 621, and a permanent magnet 622. The hollow column 63 is axially movably mounted in the through hole 51 of the cutter holder 5. The cutter holder 5 has an axially endless groove 511 concentrically extended around the through hole 51. The permanent magnet 622 is mounted within the endless groove 511. The hollow column 63 has an axially concentric flange 630 holding the coil 621 and insertable with the coil 621 into the endless groove 511 and relative to the permanent magnet 622. Further, the cutter holder 5 has an extension 52 extended in axial direction at one side of the through hole 51, and a sliding track 521 located on the extension 52 in parallel to the center axis 510 of the through hole 51. The cutter module 6 comprises a sliding block 631 fixedly fastened to the hollow column 63 and coupled to the sliding track 521, and a return spring 623 connected between the sliding block 631 and the extension 52 of the cutter holder 5. When the coil 621 is electrically connected, controlling the amount of current controls the movement of the feed mechanism 62 along the sliding track 521, and therefore the diamond cutter 7 can be moved axially along the center axis 510 of the through hole 51. When the coil 621 is electrically disconnected, the return spring 623 imparts an upward recover force to the cutter module 6, preventing damage to the diamond cutter 7.

Figure 6:
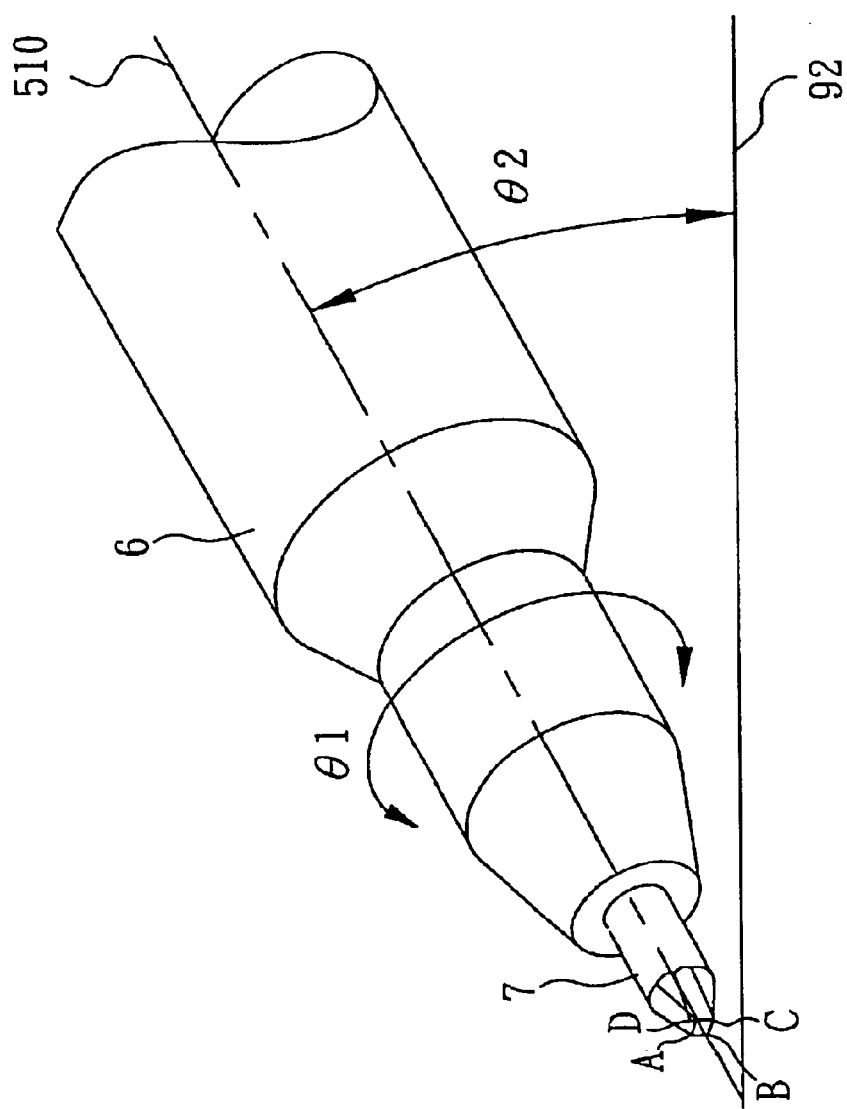
FIG. 6 is a schematic drawing showing the cutter module rotated relative to the semiconductor wafer according to the present invention.

By means of the linear or rotary motion of the lifting mechanism 3, the rotary table 4 and the feed mechanism 62 of the cutter module 6, the position of the diamond cutter 7 can be precisely adjusted, i.e., the diamond cutter 7 can be shifted vertically through a coarse manipulation of the lifting mechanism 3, and then rotated to the desired cutting angle $\theta_2$ on the workpiece, for example, a semiconductor wafer 92 (see FIG. 6) by using the rotary table 4 and then linearly adjusted through a fine micromanipulation of the feed mechanism 62 of the cutter module 6. Therefore, the relative angle and distance between the diamond cutter 7 and the semiconductor wafer 92 can be adjusted, causing the diamond cutter 7 to scribe the semiconductor wafer 92 precisely. According to the present preferred embodiment, regulating the amount of electric current to the coil 621 controls the feedrate of the feed mechanism 62. Therefore, the feed mechanism 62 can be used to control the amount of force applied to the semiconductor wafer 92 when operating the diamond cutter 7 to scribe the semiconductor wafer 92.

Furthermore, the rotary mechanism 61 of the aforesaid cutter module 6 is mounted in the inside space of the hollow column 63. The rotary mechanism 61 comprises a rotary chuck 612 holding the diamond cutter 7, a motor 611, a coupling 613 coupled between the rotary chuck 612 and the motor 611 for enabling the motor 611 to rotate the rotary chuck 612 and the diamond cutter 7 around the center axis 510 of the through hole 51, and an encoder 614 adapted to detect the angle of rotation of the motor 611. The motor 611 is carried on a mount 64, which is installed in the hollow column 63. Therefore, the diamond cutter 7 can be rotated with the rotary chuck 612, and moved axially up and down with the motor 611 and the hollow column 63.

When the diamond cutter 7 begins to wear after long uses use for example, when the cutting point B is worn out (see FIG. 6), the DC servo motor 611 of the rotary mechanism 61 is numerically controlled with the monitoring of a CCD device 901 electrically connected to a monitor 902 (see FIG. 1) to rotate the diamond cutter 7 through an angle $\theta_1$ (for example, 90°) or other predetermined angle precisely, enabling the diamond cutter 7 rotated to a precise angle to cut the workpiece with different crystal phase cutting points (for example, cutting point C, D, or A). Therefore, the diamond cutter 7 can be used repeatedly, preventing the occurrence of a precision problem due to a replacement of the diamond cutter. Further, the diamond cutter 7 can have its angle easily adjusted to a precise position with numeric control, preventing the precision problem caused by conventional manual adjustment.

When the diamond cutter 7 begins to wear after long uses use for example, when the cutting point B is worn out (see FIG. 6), the DC servo motor 611 of the rotary mechanism 61 is numerically controlled with the monitoring of a CCD device 901 electrically connected to a monitor 902 (see FIG. 1) to rotate the diamond cutter 7 through an angle $\theta_1$ (for example, 90°) or other predetermined angle precisely, enabling the diamond cutter 7 rotated to a precise angle to cut the workpiece with different crystal phase cutting points (for example, cutting point C, D, or A). Therefore, the diamond cutter 7 can be used repeatedly, preventing the occurrence of a precision problem due to a replacement of the diamond cutter. Further, the diamond cutter 7 can have its angle easily adjusted to a precise position with numeric control, preventing the precision problem caused by conventional manual adjustment.

Although the present invention has been explained in relation to its preferred embodiment, it is to be understood that many other possible modifications and variations can be made without departing from the spirit and scope of the invention as hereinafter claimed.

What is claimed is:

1. A cutting device for breaking fragile materials, comprising:
   a base frame, said base frame having a front mounting face;
   a lifting mechanism, said lifting mechanism comprising a base block fixedly mounted on the mounting face of said base frame, and a lifting block coupled to said base block for vertical movement on said base block;
   a rotary table, said rotary table comprising a fixed member fixedly mounted on the lifting block of said lifting mechanism, and a rotary member supported on said fixed member for rotation relative to said fixed member, said rotary member having a front face;
   a cutter holder installed on the front face of said rotary member, said cutter holder having a through hole, said through hole having a center axis in parallel to the front face of said rotary member; and
   a cutter module installed in the through hole of said cutter holder and holding a diamond cutter, said cutter module comprising a rotary mechanism adapted to rotate said diamond cutter around the center axis of said through hole, said rotary mechanism of said cutter module being adapted to rotate said diamond cutter around the center axis of said through hole to different angles, enabling said diamond cutter to cut a fragile material with different crystal phase cutting points, said cutter module further comprising a feed mechanism adapted to move said diamond cutter axially along the center axis of said through hole.

2. The cutting device for breaking fragile materials as claimed in claim 1, wherein the feed mechanism of said cutter module comprises a hollow column axially movably inserted into the through hole of said cutter holder, a permanent magnet mounted on said cutter holder, and a coil mounted on said hollow column relative to said permanent magnet, said coil being adapted to receive electric current and to act with said permanent magnet for controlling said feed mechanism to move axially along the center axis of said through hole subject to an amount of electric current applied to said coil.

3. The cutting device for breaking fragile materials as claimed in claim 2, wherein said cutter holder has an axially endless groove concentrically extended around said through hole; said permanent magnet being fixedly mounted inside said endless groove; said hollow column having an axially concentric flange insertable in the endless groove of said cutter holder; said coil being mounted on the concentric flange of said hollow column for acting with said permanent magnet.

4. The cutting device for breaking fragile materials as claimed in claim 2, wherein said rotary mechanism of said cutter module is mounted inside said hollow column.

5. The cutting device for breaking fragile materials as claimed in claim 2, wherein said rotary mechanism comprises a rotary chuck, holding said diamond cutter, a mount installed in said hollow column, and a motor mounted on said mount and adapted to rotate said rotary chuck.

6. The cutting device for breaking fragile materials as claimed in claim 1, wherein said cutter holder comprises an extension axially extended in an axial direction at one side of said through hole, and a sliding track located on said extension in parallel to the center axis of said through hole; said cutter module comprising a sliding block fixedly fastened to said hollow column and coupled to said sliding track for guiding an axial movement of said hollow column along said sliding track.

7. The cutting device for breaking fragile materials as claimed in claim 6, wherein said cutter module further comprises a return spring connected between said sliding block and the extension of said cutter holder and being adapted to impart an upward recover force to said cutter module.

8. The cutting device for breaking fragile materials as claimed in claim 1, wherein said lifting mechanism comprises a screw rod fastened pivotally with said base block, and a nut threaded onto said screw rod and fixedly connected to said lifting block for moving said lifting block along said screw rod upon rotation of said screw rod.

9. The cutting device for breaking fragile materials as claimed in claim 1, wherein said lifting mechanism further comprises a power drive adapted to drive said lifting block for vertical movement on said base block.

10. The cutting device for breaking fragile materials as claimed in claim 9, wherein said power drive is a motor.

11. The cutting device for breaking fragile materials as claimed in claim 1, wherein said rotary member has a raised alignment portion for supporting a bottom edge of said cutter holder.

12. The cutting device for breaking fragile materials as claimed in claim 1, further comprising a coupling plate connected between the lifting block of said lifting mechanism and the fixed member of said rotary table.

13. The cutting device for breaking fragile materials as claimed in claim 12, further comprising at least one optics sensor respectively installed in said coupling plate and adapted to detect an the angle of rotation of said rotary member.

14. The cutting device for breaking fragile materials as claimed in claim 1, further comprising a CCD device electrically connected to a monitor for monitoring and for easily adjusting the rotation of said diamond cutter around the center axis of said through hole.

15. A cutting device for breaking fragile materials, comprising:
   a base frame, said base frame having a front mounting face;
   a lifting mechanism, said lifting mechanism comprising a base block fixedly mounted on the mounting face of said base frame, and a lifting block coupled to said base block for vertical movement on said base block;
   a rotary table, said rotary table comprising a fixed member fixedly mounted on the lifting block of said lifting mechanism, and a rotary member supported on said fixed member for rotation relative to said fixed member, said rotary member having a front face;
   a cutter holder installed on the front face of said rotary member, said cutter holder having a through hole, said through hole having a center axis in parallel to the front face of said rotary member; and
   a cutter module installed in the through hole of said cutter holder and holding a diamond cutter, said cutter module comprising a rotary mechanism adapted to rotate said diamond cutter around the center axis of said through hole, said rotary mechanism comprising a rotary chuck, holding said diamond cutter, and a motor adapted to rotate said rotary chuck, said cutter module further comprising a feed mechanism adapted to move said diamond cutter axially alona the center axis of said through hole.

16. The cutting device for breaking fragile materials as claimed in claim 15, wherein said rotary mechanism further comprises a coupling coupled between said rotary chuck and the motor of said rotary mechanism.

17. The cutting device for breaking fragile materials as claimed in claim 15, wherein the feed mechanism of said cutter module comprises a hollow column axially movably inserted into the through hole of said cutter holder, a permanent magnet mounted on said cutter holder, and a coil mounted on said hollow column relative to said permanent magnet, said coil being adapted to receive electric current and to act with said permanent magnet for controlling said feed mechanism to move axially along the center axis of said through hole subject to an amount of electric current applied to said coil.

18. The cutting device for breaking fragile materials as claimed in claim 15, wherein said cutter holder comprises an extension axially extended in an axial direction at one side of said through hole, and a sliding track located on said extension in parallel to the center axis of said through hole; said cutter module comprising a sliding block fixedly fastened to said hollow column and coupled to said sliding track for guiding an axial movement of said hollow column along said sliding track.

19. The cutting device for breaking fragile materials as claimed in claim 15, wherein said lifting mechanism comprises a screw rod fastened pivotally with said base block, and a nut threaded onto said screw rod and fixedly connected to said lifting block for moving said lifting block along said screw rod upon rotation of said screw rod.

20. The cutting device for breaking fragile materials as claimed in claim 15, further comprising a CCD device electrically connected to a monitor for monitoring and for easily adjusting the rotation of said diamond cutter around the center axis of said through hole.

* * * * *